(12) United States Patent
Kwon et al.

(10) Patent No.: US 12,065,603 B2
(45) Date of Patent: Aug. 20, 2024

(54) QUANTUM DOT, LIGHTING EMITTING ELEMENT AND DISPLAY DEVICE INCLUDING THE SAME

(71) Applicants: Samsung Display Co., Ltd., Yongin-si (KR); Research & Business Foundation SUNGKYUNKWAN UNIVERSITY, Suwon-si (KR)

(72) Inventors: Sunyoung Kwon, Seoul (KR); Wan Ki Bae, Suwon-si (KR); Donghyo Hahm, Suwon-si (KR); Keunchan Oh, Hwaseong-si (KR); Hyeokjin Lee, Seongnam-si (KR); Seong-Pil Huh, Suwon-si (KR)

(73) Assignees: Samsung Display Co., Ltd., Yongin-si (KR); Research & Business Foundation Sungkyunkwan University, Suwon-si (KR)

(*) Notice: Subject to any disclaimer, the term of this patent is extended or adjusted under 35 U.S.C. 154(b) by 434 days.

(21) Appl. No.: 17/365,887

(22) Filed: Jul. 1, 2021

(65) Prior Publication Data
US 2022/0064527 A1  Mar. 3, 2022

(30) Foreign Application Priority Data

Aug. 28, 2020 (KR) .................. 10-2020-0108921

(51) Int. Cl.
| | | |
|---|---|---|
| C09K 11/88 | (2006.01) | |
| B82Y 20/00 | (2011.01) | |
| B82Y 40/00 | (2011.01) | |
| C09K 11/08 | (2006.01) | |
| C09K 11/74 | (2006.01) | |
| H10K 50/115 | (2023.01) | |
| H10K 59/38 | (2023.01) | |

(52) U.S. Cl.
CPC ........ *C09K 11/883* (2013.01); *C09K 11/0883* (2013.01); *C09K 11/7492* (2013.01); *H10K 50/115* (2023.02); *H10K 59/38* (2023.02); *B82Y 20/00* (2013.01); *B82Y 40/00* (2013.01)

(58) Field of Classification Search
CPC .... H10K 59/115; H10K 59/38; C09K 11/883; C09K 11/7492; C09K 11/0883
See application file for complete search history.

(56) References Cited

U.S. PATENT DOCUMENTS

| | | | |
|---|---|---|---|
| 10,214,686 B2 | 2/2019 | Dubrow | |
| 2009/0053522 A1* | 2/2009 | Sekiguchi | B82Y 30/00 |
| | | | 428/375 |
| 2018/0327664 A1* | 11/2018 | Houtepen | C09K 11/62 |
| 2020/0102494 A1 | 4/2020 | Mocatta et al. | |

FOREIGN PATENT DOCUMENTS

| | | | |
|---|---|---|---|
| JP | 2009-132777 | * | 6/2009 |
| KR | 10-2017-0077944 A | | 7/2017 |
| KR | 10-1904968 B1 | | 10/2018 |
| WO | WO 2013/127662 | * | 9/2013 |
| WO | 2019/194749 A1 | | 10/2019 |

* cited by examiner

*Primary Examiner* — C Melissa Koslow
(74) *Attorney, Agent, or Firm* — Lewis Roca Rothgerber Christie LLP

(57) ABSTRACT

A quantum dot includes a first core layer and a shell layer surrounding the first core layer, wherein a difference in lattice constants between the first core layer and the shell layer is controlled to be 3% or less. The quantum dot according to an embodiment may be applied to a light emitting element and a display device, thereby providing improved luminous efficiency.

18 Claims, 10 Drawing Sheets

QUANTUM DOT, LIGHTING EMITTING ELEMENT AND DISPLAY DEVICE INCLUDING THE SAME

CROSS-REFERENCE TO RELATED APPLICATIONS

This application claims priority to and the benefit of Korean Patent Application No. 10-2020-0108921, filed on Aug. 28, 2020, in the Korean Intellectual Property Office, the entire content of which is hereby incorporated by reference.

BACKGROUND

1. Field

The present disclosure herein relates to a quantum dot, a light emitting element including the quantum dot, and a display device including the light emitting element.

2. Description of Related Art

Various kinds of display devices utilized for multimedia devices such as a television set, a mobile phone, a tablet computer, a navigation system, and/or a game console are being developed. In such display devices, a so-called self-luminescent display element is utilized, which accomplishes display by causing an organic compound-containing light emitting material to emit light.

In addition, the development of a light emitting element utilizing quantum dots as a light emitting material is underway in an effort to enhance the color reproducibility of display devices, and there is a demand for increasing the service life (e.g., lifespan) and luminous efficiency of a light emitting element utilizing quantum dots.

SUMMARY aspects according to embodiments of the present disclosure are directed toward a quantum dot having improved luminous efficiency, the quantum dot including a core layer and a shell layer and having a controlled lattice constant difference therebetween.

Aspects according to embodiments of the present disclosure are also directed toward a light emitting element including a quantum dot and a display device including the same, the quantum dot containing a core layer and a shell layer, and having a controlled lattice constant difference therebetween, thereby exhibiting improved element service life and luminous efficiency.

According to an embodiment of the present disclosure, a quantum dot includes a core and a shell layer around the core, wherein a difference in lattice constant therebetween is 3% or less.

The core may include a Group 13 element and a Group 15 element, and the shell layer may include a Group 12 element and a Group 16 element.

The quantum dot may further include a first core layer between the core and the shell layer, the first core layer around the core.

The first core layer may include a Group 13 element and a Group 15 element, and the core may include all elements included in the first core layer and may further include at least one Group 13 element.

The core may be greater in thickness than the first core layer.

The core may be about 1 nm to about 2 nm in thickness, and the first core layer may be about 0 nm to about 1 nm in thickness.

A difference in lattice constants between the shell layer and the first core layer may be 4% or greater.

The shell layer may be greater in thickness than the first core layer.

The shell layer may be 1 nm or greater in thickness.

The shell layer may include a compound represented by Formula 3 below.

$$EF_zF'_{1-z}$$ Formula 3

In Formula 3 above, E is a Group 12 element, F and F' are each independently a Group 16 element, and z is 0 to 1.

The shell layer may include $ZnSe_zS_{1-z}$, and z may be 0 to 1.

The first core layer may include a compound represented by Formula 1 below, and the core may include a compound represented by Formula 2 below.

$$AB$$ Formula 1

$$A_{1-y}(A'_xA''_{1-x})_yB$$ Formula 2

In Formulas 1 and 2 above, A, A', and A" are each independently a Group 13 element, B is a Group 15 element, and x and y each are greater than 0 and less than 1.

The core may include $In_{1-y}(Ga_xAl_{1-x})_yP$, the first core layer may include InP, and x and y may each independently be greater than 0 and less than 1.

In an embodiment of the present disclosure, a light emitting element includes a first electrode, a hole transport region on the first electrode, an emission layer on the hole transport region and including a plurality of quantum dots, an electron transport region on the emission layer, and a second electrode on the electron transport region, wherein the plurality of quantum dots each include a core, a first core layer around the core, and a shell layer around the first core layer, and a difference in lattice constants between the core and the shell layer is 3% or less.

The core and the first core layer may each independently include a Group 13 element and a Group 15 element, and the shell layer may include a Group 12 element and a Group 16 element.

The core may be about 1 nm to about 2 nm in thickness, the first core layer may be about 0 nm to about 1 nm in thickness, and the shell layer may be 1 nm or greater in thickness.

In an embodiment of the present disclosure, a display device includes a display panel, and a light conversion layer on the display panel and including at least one light control unit containing quantum dots, wherein the quantum dots each include a core and a shell layer around the core, and having a difference in lattice constants of 3% or less between the shell layer and the core.

The display panel may include a light emitting element configured to generate a first light, and the light conversion layer may include a first light control unit configured to transmit the first light, a second light control unit configured to convert the first light into a second light, and a third light control unit configured to convert the first light into a third light.

The display device may further include a first core layer around the core and between the core and the shell layer.

The display device may further include a color filter layer on the light conversion layer, wherein the color filter layer may include a first filter configured to transmit a first light, a second filter configured to transmit a second light, and a third filter configured to transmit a third light.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
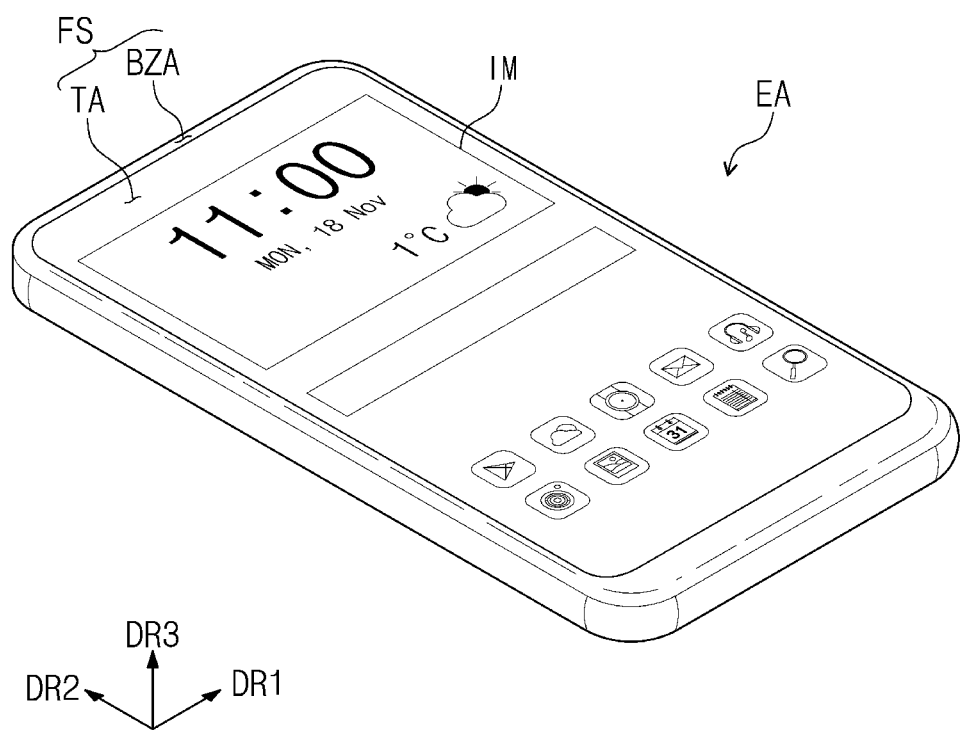
FIG. 1 is a perspective view of an electronic device of an embodiment.

The present disclosure may be modified in many alternate forms, and thus specific embodiments will be illustrated in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

In the present description, when an element (or a region, a layer, a portion, etc.) is referred to as being "on," "connected to," or "coupled to" another element, it refers to that the element may be directly disposed on/connected to/coupled to the other element, or that a third element may be disposed therebetween.

Meanwhile, in the present disclosure, the term "directly disposed" refers to that there is no layer, film, region, plate and/or the like added between a portion of a layer, a film, a region, a plate and/or the like and other portions. For example, "directly disposed" may refer to disposing without additional members such as an adhesive member between two layers or two members.

Like reference numerals refer to like elements. Also, in the drawings, the thickness, the ratio, and the dimensions of elements may be exaggerated for an effective description of technical contents.

The term "and/or" includes all combinations of one or more of which associated configurations may define.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and will not be interpreted in an idealized or overly formal sense unless expressly so defined herein.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a quantum dot composition according to an embodiment of the present disclosure, a light emitting element including the quantum dot, and a display device including the same will be described with reference to the accompanying drawings.

Figure 2:
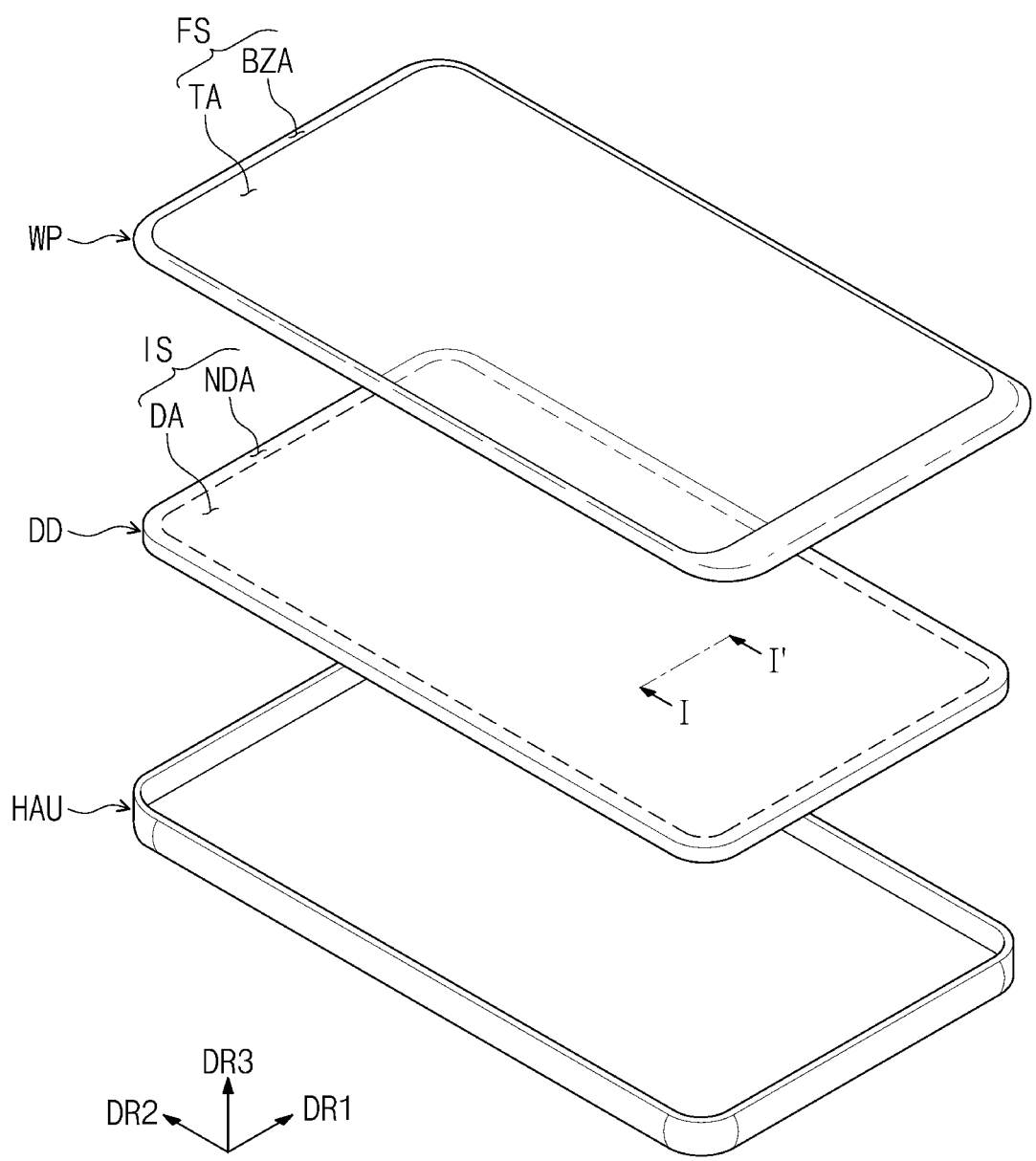
FIG. 2 is an exploded perspective view of an electronic device of an embodiment.
Figure 3:
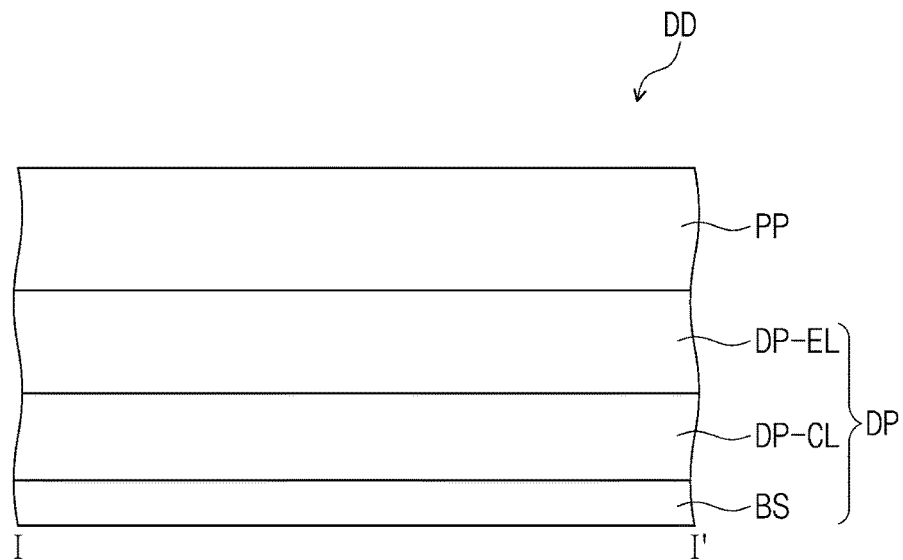
FIG. 3 is a cross-sectional view of a display device according to an embodiment, corresponding to the line I-I' of FIG. 2.
Figure 4:
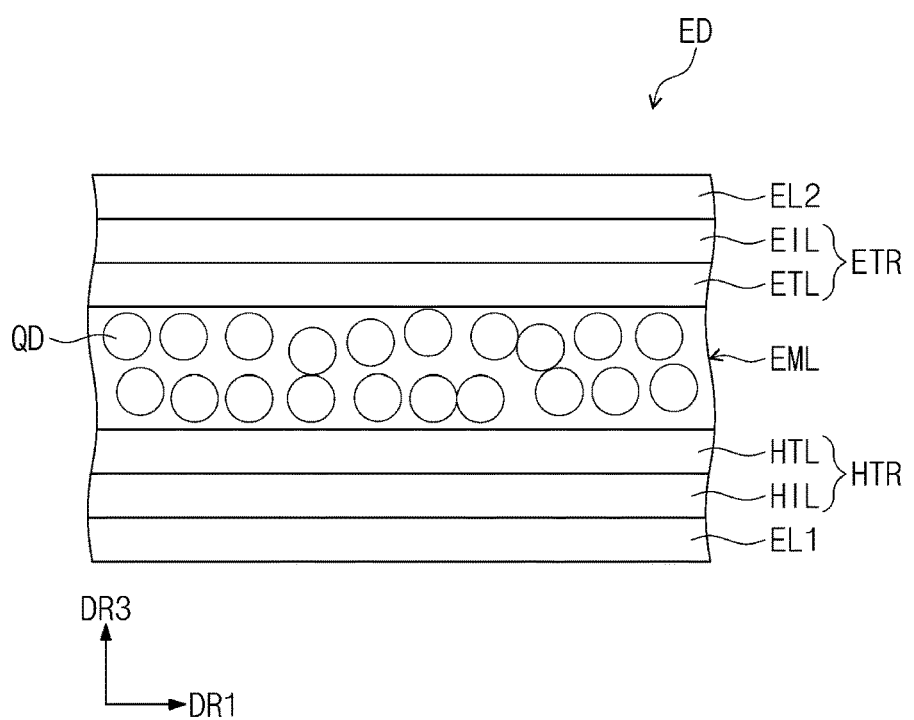
FIG. 4 is a cross-sectional view of a light emitting element of an embodiment.

FIG. 1 is a perspective view of an electronic device EA of an embodiment. FIG. 2 is an exploded perspective view of an electronic device EA of an embodiment. FIG. 3 is a cross-sectional view of a display device DD according to an embodiment, corresponding to the line I-I' of FIG. 2. FIG. 4 is a cross-sectional view of a light emitting element ED of an embodiment.

In an embodiment, an electronic device EA may be a large-sized electronic device such as a television set, a monitor, and/or an outdoor billboard. In addition, the electronic device EA may be a small- and/or medium-sized electronic device such as a personal computer, a laptop computer, a personal digital terminal, a car navigation unit, a game console, a smartphone, a tablet, and/or a camera. However, these are merely presented as an example, and thus it may be adopted for other electronic devices without departing from the subject matter of the present disclosure. In the present embodiment, a smartphone is illustrated as the electronic device EA.

The electronic device EA may include a display device DD and a housing HAU. The display device DD may display an image IM through a display surface IS, and a user may view an image provided through a transmission area TA corresponding to a front surface FS of the electronic device EA. The image IM may include a still image as well as a dynamic image. FIG. 1 illustrates that the front surface FS is parallel to a plane defined by a first direction DR1 and a second direction DR2 crossing (e.g., normal or perpendicular to) the first direction DR1. However, this is presented as an example, and in another embodiment, the front surface FS of the electronic device EA may have a curved shape.

From among the normal (e.g., perpendicular) directions of front surface FS of the electronic device EA, that is, the thickness directions of the electronic device EA, a direction in which the image IM is displayed is indicated by a third direction DR3. A front surface (or an upper surface) and a rear surface (or a lower surface) of respective members may be defined by the third direction DR3.

A fourth direction DR4 (see FIG. 8) may be a direction between the first direction DR1 and the second direction DR2. The fourth direction DR4 may be positioned on a plane parallel to the plane defined by the first direction DR1 and the second direction DR2. Meanwhile, the directions indicated by the first to fourth directions DR1, DR2, DR3 and DR4 are relative concepts, and may thus be changed to other directions.

In some embodiments, the electronic device EA may include a foldable display device having a folding area and a non-folding area, or a bending display device having at least one bent portion.

The electronic device EA may include a display device DD and a housing HAU. In the electronic device EA, the front surface FS may correspond to a front surface of the display device DD, and may correspond to a front surface of a window WP. Accordingly, the front surface of the electronic device EA, the front surface of the display device DD, and the front surface of the window WP will be given the same reference numerals FS.

The housing HAU may accommodate the display device DD. The housing HAU may be disposed to cover the display device DD such that an upper surface, which is the display surface IS of the display device DD, is exposed. The housing HAU may cover a side surface and a bottom surface of the display device DD, and expose an overall upper surface. However, the embodiment of the present disclosure is not limited thereto, and the housing HAU may cover a portion of the upper surface as well as the side and bottom surfaces of the display device DD.

In the electronic device EA of an embodiment, the window WP may include an optically transparent insulating material. The window WP may include a transmission area TA and a bezel area BZA. The front surface FS of the window WP (the front surface FS including the transmission area TA and the bezel area BZA) corresponds to the front surface FS of the electronic device EA.

In FIGS. 1 and 2, the transmission area TA is shown in a rectangular shape with vertices rounded. However, this is presented as an example, and the transmission area TA may have various suitable shapes and is not limited to any one embodiment.

The transmission area TA may be an optically transparent area. The bezel area BZA may be an area having a relatively lower light transmittance than the transmission area TA. The bezel area BZA may have a set or predetermined color. The bezel area BZA may be adjacent to the transmission area TA and surround the transmission area TA. The bezel area BZA may define the shape of the transmission area TA. However, the embodiment of the present disclosure is not limited to the one illustrated, and the bezel area BZA may be disposed adjacent to only one side of the transmission area TA, or a portion thereof may be omitted.

The display device DD may be disposed below the window WP. In the present description, the term "below" may indicate a direction opposite to the direction in which the display device DD provides an image.

In an embodiment, the display device DD may be substantially configured to generate an image IM. The image IM generated in the display device DD is displayed on the display surface IS, and is viewed by a user through the transmission area TA from the outside. The display device DD includes a display area DA and a non-display area NDA. The display area DA may be an area activated according to electrical signals. The non-display area NDA may be an area covered by the bezel area BZA. The non-display area NDA is adjacent to the display area DA. The non-display area NDA may surround the display area DA.

Referring to FIG. 3, the display device DD may include a display panel DP and a light control layer PP disposed on the display panel DP. The display panel DP may include a display element layer DP-EL. The display element layer DP-EL includes a light emitting element ED.

The light control layer PP may be disposed on the display panel DP to control reflected light from the display panel DP due to external light, e.g., to control reflection of external light by the display panel DP. The light control layer PP may include, for example, a polarizing layer and/or a color filter layer.

In the display device DD of an embodiment, the display panel DP may be a light emitting display panel. For example, the display panel DP may be a quantum dot light emitting display panel including a quantum dot light emitting element. However, the embodiment of the present disclosure is not limited thereto.

The display panel DP may include a base substrate BS, a circuit layer DP-CL disposed on the base substrate BS, and a display element layer DP-EL disposed on the circuit layer DP-CL.

The base substrate BS may be a member providing a base surface on which the display element layer DP-EL is disposed. The base substrate BS may be a glass substrate, a metal substrate, a plastic substrate, etc. However, the embodiment of the present disclosure is not limited thereto, and the base substrate BS may be an inorganic layer, an organic layer, or a composite material layer. The base substrate BS may be a flexible substrate that may be readily bent or folded.

In an embodiment, the circuit layer DP-CL may be disposed on the base substrate BS, and may include a plurality of transistors. The transistors may each include a control electrode, an input electrode, and an output electrode. For example, the circuit layer DP-CL may include a switching transistor and a driving transistor to drive the light emitting element ED of the display element layer DP-EL.

FIG. 4 is a view showing a light emitting element ED according to an embodiment, and referring to FIG. 4, the light emitting element ED according to an embodiment includes a first electrode EL1, a second electrode EL2 facing the first electrode EL1, and a plurality of functional layers disposed between the first electrode EL1 and the second electrode EL2 and including an emission layer EML.

The plurality of functional layers may include a hole transport region HTR disposed between the first electrode EL1 and the emission layer EML, and an electron transport region ETR disposed between the emission layer EML and the second electrode EL2. Meanwhile, a capping layer may be further disposed on the second electrode EL2 in an embodiment.

The hole transport region HTR and the electron transport region ETR may each include a plurality of sub-functional layers. For example, the hole transport region HTR may include a hole injection layer HIL and a hole transport layer HTL as sub-functional layers, and the electron transport region ETR may include an electron injection layer EIL and an electron transport layer ETL as sub-functional layers. However, the embodiment of the present disclosure is not limited thereto, and the hole transport region HTR may further include an electron blocking layer as a sub-functional layer, and the electron transport region ETR may further include a hole blocking layer as a sub-functional layer.

In the light emitting element ED according to an embodiment, the first electrode EL1 has conductivity. The first electrode EL1 may be formed of a metal alloy or a conductive compound. In some embodiments, the first electrode EL1 may be an anode. The first electrode EL1 may be a pixel electrode.

In the light emitting element ED according to an embodiment, the first electrode EL1 may be a reflective electrode. However, the embodiment of the present disclosure is not limited thereto. For example, the first electrode EL1 may be a transmissive electrode, or may be a transflective electrode. When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). Alternatively, the first electrode EL1 may have a multi-layer structure including a reflective film or a transflective film formed of the materials described above as an example, and a transparent conductive film formed of indium tin oxide (ITO), indium zinc oxide (IZO), zinc oxide (ZnO), indium tin zinc oxide (ITZO), etc. For example, the first electrode EL1 may be a multi-layer metal film, and may have a stack structure of metal films of ITO/Ag/ITO.

The hole transport region HTR is provided on the first electrode EL1. The hole transport region HTR may include a hole injection layer HIL, a hole transport layer HTL, etc. In addition, the hole transport region HTR may further include at least one of a hole buffer layer or an electron blocking layer in addition to the hole injection layer HIL and the hole transport layer HTL. The hole buffer layer may compensate a resonance distance according to wavelengths of light emitted from an emission layer EML, and may thus increase luminous efficiency. Materials which may be included in the hole transport region HTR may be utilized as materials included in the hole buffer layer. The electron blocking layer is a layer that serves to prevent or substantially prevent electrons from being injected from the electron transport region ETR to the hole transport region HTR.

The hole transport region HTR may have a single layer formed of a single material, a single layer formed of a plurality of different materials, or a multi-layer structure including a plurality of layers formed of a plurality of different materials. For example, the hole transport region HTR may have a single-layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in the stated order from the first electrode EL1, but the embodiment of the present disclosure is not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPD), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include any suitable material (e.g., general materials known in the art). The hole transport layer HTL may further include, for example, carbazole-based derivatives (such as N-phenyl carbazole and polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(naphthalene-1-yl)-N,N'-diphenyl-benzidine (NPD), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may have a thickness of about 5 nm to about 1500 nm, for example, about 10 nm to about 500 nm. The hole injection layer HIL may have a thickness of, for example, about 3 nm to about 100 nm, and the hole transport layer HTL may have a thickness of about 3 nm to about 100 nm. For example, the electron blocking layer EBL may have a thickness of about 1 nm to about 100 nm. When the thicknesses of the hole transport region HTR, the hole injection layer HIL, the hole transport layer HTL, and the electron blocking layer EBL satisfy the above-described ranges, satisfactory electron injection properties may be obtained without a substantial increase in driving voltage.

An emission layer EML is provided on the hole transport region HTR. The emission layer EML includes a plurality of quantum dots QD.

The quantum dots QD included in the emission layer EML may be stacked to form a layer. In FIG. 4, for example, the quantum dots QD having a circular cross-section are arranged to form two layers, but the embodiment of the present disclosure is not limited thereto. For example, the arrangement of the quantum dots OD may vary according to a thickness of the emission layer EML, a shape of the quantum dots QD included in the emission layer EML, and an average diameter of the quantum dots QD. For example, in the emission layer EML, the quantum dots QD may be aligned to be adjacent to each other to form a single layer, or may be aligned to form a plurality of layers such as two or three layers. The quantum dots QD according to an embodiment will be described in more detail later through FIGS. 5 to 7 below.

In addition, in the light emitting element ED of an embodiment, the emission layer EML may include a host and a dopant. In an embodiment, the emission layer EML may include the quantum dots QD as a dopant material. In addition, in an embodiment, the emission layer EML may further include a host material.

Meanwhile, in the light emitting element ED of an embodiment, the emission layer EML may emit fluorescence. For example, the quantum dots QD may be utilized as a fluorescent dopant material.

In the light emitting element ED of an embodiment, an electron transport region ETR is provided on the emission layer EML. The electron transport region ETR may include at least one selected from a hole blocking layer, an electron transport layer ETL, and an electron injection layer EIL, but the embodiment of the present disclosure is not limited thereto.

The electron transport region ETR may have a single layer formed of a single material, a single layer formed of a plurality of different materials, or a multi-layer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL, or a hole blocking layer/electron transport layer ETL/electron injection layer EIL are stacked in the stated order from the emission layer EML, but the present disclosure is not limited thereto. The thickness of the electron transport region ETR may be, for example, from about 20 nm to about 150 nm.

The electron transport region ETR may be formed utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the embodiment of the present disclosure is not limited thereto, and the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoirnidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), or a mixture thereof. The thickness of the electron transport layer ETL may be from about 10 nm to about 100 nm, and may be, for example, from about 15 nm to about 50 nm. When the thicknesses of the electron transport layers ETL satisfy the above-described ranges, satisfactory electron transport properties may be obtained without a substantial increase in driving voltage.

When the electron transport region ETR includes the electron injection layer EIL, the electron transport region ETR may include a halogenated metal (such as LiF, NaCl, CsF, Yb, RbCl, and/or RbI), a lanthanide metal (such as Yb), a metal oxide (such as Li$_2$O and/or BaO), and/or lithium quinolate (LiQ), but the embodiment of the present disclosure is limited thereto. The electron injection layer EIL may also be formed of a mixture material of an electron transport material and an insulating (e.g., non-conductive) organo-metal salt. The organo-metal salt may include, for example, metal acetates, metal benzoates, metal acetoacetates, metal acetylacetonates, and/or metal stearates. The thicknesses of the electron injection layers EIL may be about 0.1 nm to about 10 nm, or about 0.3 nm to about 9 nm. When the thicknesses of the electron injection layers EIL satisfy the above-described ranges, satisfactory electron injection properties may be obtained without a substantial increase in driving voltage.

The electron transport region ETR, as described above, may include a hole blocking layer. The hole blocking layer may include, for example, at least one of 2,9-dimethyl-4,7-diphenyl-1,10-phenanthroline (BCP) or 4,7-diphenyl-1,10-phenanthroline (Bphen), but the present disclosure is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof (e.g., AgYb, a compound of AgMg and MgAg according to an amount, etc.), or a mixture thereof (e.g., a mixture of Ag and Mg). In an embodiment, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc.

In some embodiments, the second electrode EL2 may be connected with an auxiliary electrode. When the second electrode EL2 is connected with the auxiliary electrode, the resistance of the second electrode EL2 may decrease.

Figure 5:
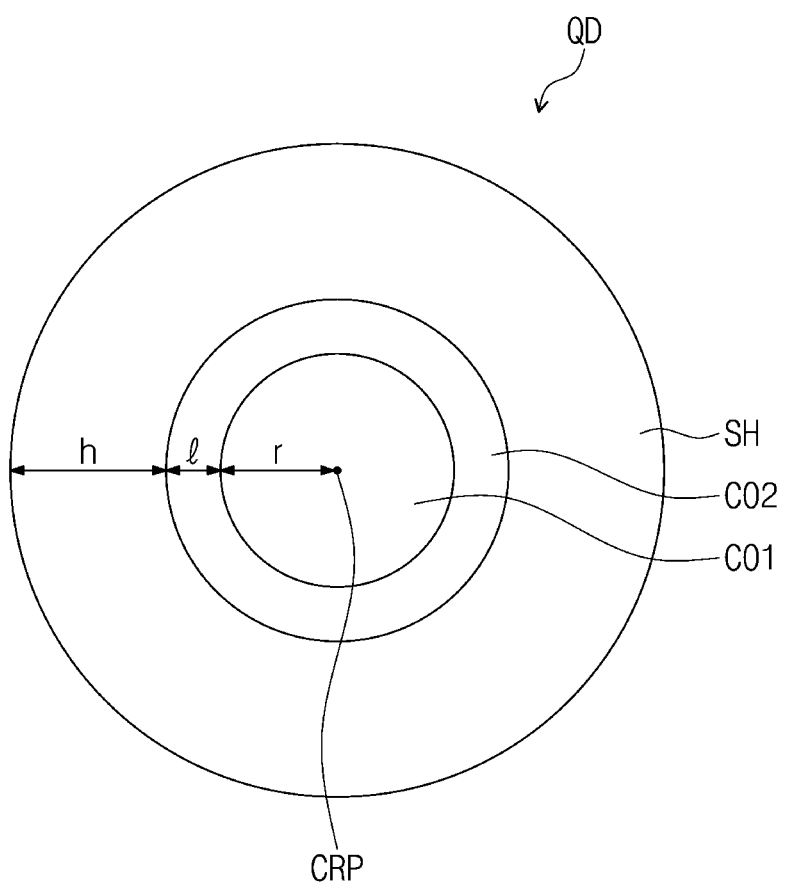
FIG. 5 is a cross-sectional view showing a quantum dot according to an embodiment.
Figure 6:
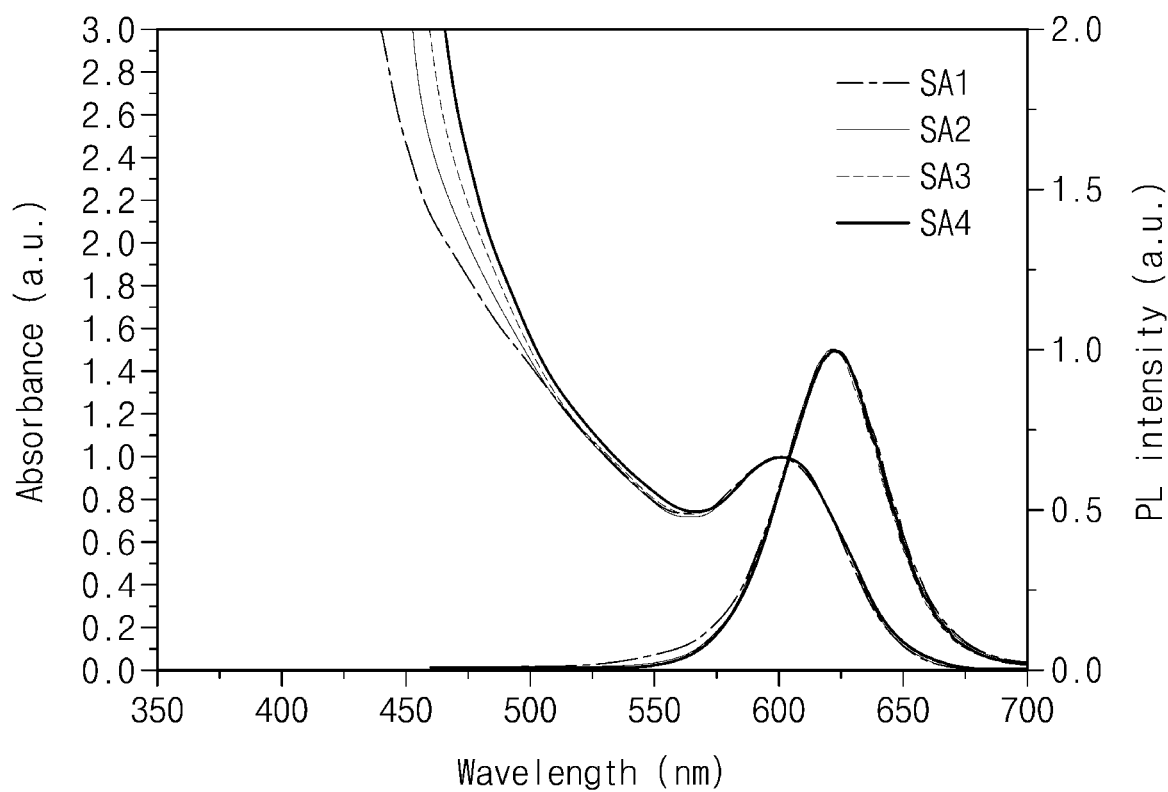
FIG. 6 is an absorption and emission spectrum of a quantum dot according to an embodiment.
Figure 7:
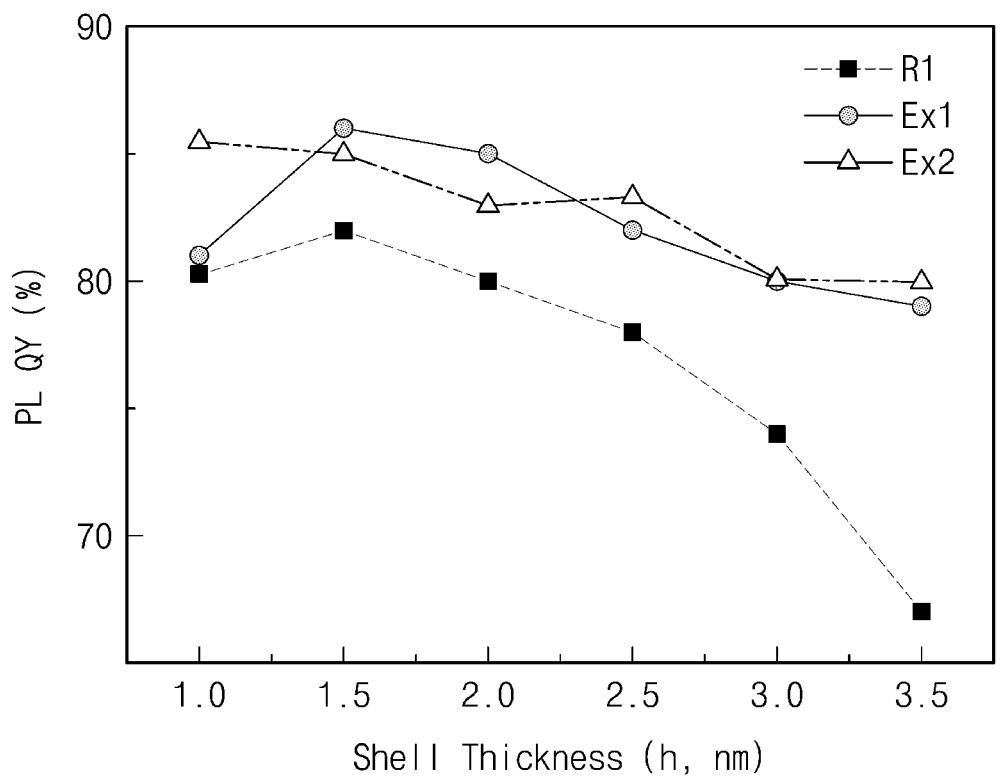
FIG. 7 is a graph measuring the efficiency of a light emitting element according to an embodiment and a Comparative Example.

FIG. 5 is a cross-sectional view showing a quantum dot QD of an embodiment. FIG. 6 is an absorption and emission spectrum of a quantum dot QD according to an embodiment. FIG. 7 is a graph measuring the efficiency of a light emitting element according to an embodiment and a Comparative Example.

Referring to FIG. 5, a quantum dot QD according to an embodiment includes a core CO1 and a shell layer SH around (e.g., surrounding) the core CO1, and a difference in lattice constants between the core CO1 and the shell layer SH is 3% or less. In an embodiment, the difference in lattice constants between the core CO1 and the shell layer SH is 1% or less. In the quantum dot QD, the core CO1 and the shell layer SH each have a lattice constant value determined according to materials therein (e.g., determined according to materials forming the respective layer). The quantum dot QD according to an embodiment of the present disclosure controls a difference in lattice constants between the core CO1 and the shell layer SH to be 3% or less to control factors that may decrease luminous efficiency, such as each layer's interfacial deformation that may be caused in the process of forming the quantum dot QD.

In an embodiment, the quantum dot QD may further include a first core layer CO2 around (e.g., surrounding) the core CO1 and disposed between the core CO1 and the shell layer SH. In this case, the shell layer SH may surround the first core layer QD2. In addition, in some embodiments, the quantum dot QD may further include a ligand bonded to a surface thereof.

The core CO1 may include a central portion CRP, and a thickness r of the core CO1 may indicate an average distance from the central portion CRP to a surface of the core CO1. As shown in FIG. 4, when the quantum dot OD has a spherical shape, the thickness r of the core CO1 may be a radius of the sphere. However, the embodiment is not particularly limited thereto, and for example, the quantum dot QD may be a pyramidal or multi-arm quantum dot, or in the form of cubic nanoparticles, nanotubes, nanowires, nanofibers, nanoparticles, etc.

In an embodiment, the thickness r of the core CO1 may be greater than a thickness I of the first core layer CO2. The thickness I of the first core layer CO2 may indicate an average distance from a surface of the core CO1 to a surface of the first core layer CO2. For example, the thickness r of the core CO1 may be about 1 nm to about 2 nm.

In an embodiment, the thickness I of the first core layer CO2 may be about 0 nm to about 1 nm. When the thickness I of the first core layer CO2 is 0 nm, it may indicate that the first core layer CO2 is not present. When the quantum dot QD includes the first core layer CO2, the thickness I of the first core layer CO2 may be about 0.01 nm to about 1 nm.

The shell layer SH of the quantum dot QD may serve as a protection layer to reduce or prevent the chemical deformation of the core layers CO1 and CO2 so as to maintain semiconductor properties, and/or serve as a charging layer to impart electrophoresis properties to the quantum dot QD.

In an embodiment, a difference in lattice constants between the shell layer SH and the first core layer CO2 may be 4% or greater.

In an embodiment, a thickness h of the shell layer SH may be greater than the thickness I of the first core layer CO2. The thickness h of the shell layer SH may indicate an average distance from a surface of the first core layer CO2 to a surface of the shell layer SH. For example, the thickness h of the shell layer SH may be 1 nm or greater. In addition, an upper limit of the thickness h of the shell layer SH is not particularly limited, and may be, for example, 10 nm or less.

In the quantum dot QD of an embodiment, the shell layer SH may include a metal oxide, a non-metal oxide, a semiconductor compound, or a combination thereof. The metal oxide or non-metal oxide may be, for example, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, or a ternary compound such as $MgAl_2O_4$, $CoFe_2O_4$, $NiFe_2O_4$, and/or $CoMn_2O_4$, but the embodiment of the present disclosure is not limited thereto. In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

In an embodiment, the shell layer SH may include Group 12 (i.e., Group II) elements and Group 16 (i.e., Group VI) elements. For example, the shell layer SH may include a compound represented by Formula 3 below.

$$EF_zF'_{1-z} \qquad \text{Formula 3}$$

In Formula 3 above, E is an element of Group 12, F and F' are each independently a Group 16 element, and z is 0 to 1. For example, F and F' are different from each other and z is a real number.

In an embodiment, the shell layer SH may include $ZnSe_zS_{1-z}$. Here, z is the same as defined in Formula 3.

In the quantum dot QD of an embodiment, the core CO1 and/or the first core layer CO2 may be a semiconductor nanocrystal that may be selected from Group 12-16 (i.e., Group II-VI) compounds, Group 13-16 (i.e., Group III-VI) compounds, Group 13-15 (i.e., Group III-V) compounds, Group 14-16 (i.e., Group IV-VI) compounds, Group 14 (i.e., Group IV) elements, Group 14 (i.e., Group IV) compounds, and a combination thereof.

Group 12-16 compounds may be selected from the group consisting of a binary compound selected from the group consisting of CdSe, CdTe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof.

Group 13-16 compounds may include a binary compound (such as $In_2S_3$ and/or $In_2Se_3$), a ternary compound (such as $InGaS_3$ and/or $InGaSe_3$), or any combination thereof.

Group 13-15 compounds may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InGaAlP, InAlNP, InAlNAs, InAlNSb, InAlPAs, InAlPSb, and a mixture thereof. The Group 13-15 semiconductor compounds may further include Group 12 metals (e.g., InZnP, etc.).

Group 14-16 compounds may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group 14 element may be selected from the group consisting of Si, Ge, and a mixture thereof. Group 14 compounds may be a binary compound selected from the group consisting of SiC, SiGe, and a mixture thereof.

The Group 11-13-16 (i.e., Group I-III-VI) semiconductor compounds may include a ternary compound such as AgInS, $AgInS_2$, CuInS, $CuInS_2$, $CuGaO_2$, $AgGaO_2$, $AgAlO_2$, or any combination thereof.

The binary compounds, ternary compounds, or quaternary compounds may be present in particles in a uniform concentration distribution, or may be present in the same particle in a partially different concentration distribution (e.g., in a non-uniform concentration distribution). An interface between the core layers CO1 and CO2 and the shell layer SH may have a concentration gradient in which a concentration of an element present in the shell layer SH becomes lower towards the center of the quantum dot.

In an embodiment, the core CO1 and the first core layer CO2 of the quantum dot OD may include Group 13 (i.e., Group III) elements and Group 15 (i.e., Group V) elements. When the first core layer CO2 includes one element of Group 13 and one element of Group 15, the core CO1 may include all elements of Group 13 and Group included in the first core layer CO2, and may further include at least one Group 13 element. For example, the first core layer CO2 may include a compound represented by Formula 1 below, and the core CO1 may include a compound represented by Formula 2 below.

$$AB \quad \quad \text{Formula 1}$$

$$A_{1-y}(A'_xA''_{1-x})_yB \quad \quad \text{Formula 2}$$

In Formulas 1 and 2, A, A', and A" are each independently an element of Group 13, B is an element of Group 15, and x and y are each independently greater than 0 and less than 1. For example, A, A', and A" are different from each other, and x and y are each independently a real number.

In some embodiments, the first core layer CO2 may include a binary compound selected from the group consisting of GaN, GaP, GaAs, GaSb, AlN, AlP, AlAs, AlSb, InN, InP, InAs, InSb, and a mixture thereof. The core CO1 may include a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a mixture thereof; or a quaternary compound selected from the group consisting of GaAlNAs, GaAlNSb, GaAlPAs, GaAlPSb, GaInNP, GaInNAs, GaInNSb, GaInPAs, GaInPSb, InGaAlP, InAlNP, InAlNAs, InAlNSb, InAlPAs, InAlPSb, and a mixture thereof. In an embodiment, the first core layer may include InP, and the core may include $In_{1-y}(Ga_xAl_{1-x})_yP$. Here, x and y are the same as defined in Formula 2.

In the quantum dot QD according to an embodiment, when the shell layer SH includes Group 12 elements and Group 16 elements (e.g., ZnSe), the lattice constant may be about 5.67 Å, and when the core CO1 includes two or more elements of Group 13 and one element of Group 15 (e.g., $In_{1-y}(Ga_xAl_{1-x})_yP$), the lattice constant may be about 5.6 Å to about 5.8 Å, and a difference in lattice constants may thus be controlled to be within 3% (e.g., based on the lattice constant of the shell layer). When the first core layer CO2 includes one element of Group 13 and one element of Group 15 (e.g., In P), the lattice constant may be about 5.9 Å, and a difference in lattice constants between the first core layer CO2 and the shell layer SH may be 4% or greater (e.g., based on the lattice constant of the shell layer).

The quantum dot QD may have a full width of half maximum (FWHM) of a light emission wavelength spectrum of about 45 nm or less, for example, about 40 nm or less, or about 30 nm or less, and color purity or color reproducibility may be enhanced when the FWHM is in the above ranges. In addition, light emitted through such a quantum dot is emitted in all directions, and a wide viewing angle may thus be improved. That is, a wider viewing angle may be achieved.

The quantum dot QD may control colors of emitted light according to particle sizes thereof, and accordingly, the quantum dot OD may have various suitable light emission colors such as blue, red, green, etc. The smaller the particle size of the quantum dot OD is, the shorter the wavelength the emitted light may have. For example, in the quantum dot QD having the same core, the particle size of a quantum dot emitting green light may be smaller than the particle size of a quantum dot emitting red light. In addition, in the quantum dot QD having the same core, the particle size of a quantum dot emitting blue light may be smaller than the particle size of a quantum dot emitting green light. However, the embodiment of the present disclosure is not limited thereto, and even in the quantum dot QD having the same core, particle sizes may be adjusted according to the forming-materials and a thickness of a shell.

In some embodiments, when the quantum dot QD has various suitable light emission colors such as blue, red, green, etc., the quantum dot QD having a different light emission color may have a different core material. In FIG. 6, light emitting (PL intensity) spectrum is shown. Example quantum dots SA1 to SA4 each have a core containing $In_{0.84}Al_{0.16}P$ with a thickness of 1.4 nm, a first core layer containing InP with a thickness of 0.3 nm, and a shell layer containing ZnSe, except that a thickness of the shell layer is different. Specifically, the Example quantum dot 1 SA1 has a shell layer with a thickness of 1 nm, the Example quantum dot 2 SA2 has a shell layer with a thickness of 2 nm, the Example quantum dot 3 SA3 has a shell layer with a thickness of 3 nm, and the Example quantum dot 4 SA4 has a shell layer with a thickness of 3.5 nm.

Referring to FIG. 6, it was found that the absorption and emission spectra of the Example quantum dots SA1 to SA4 are kept quite similar despite an increased thickness of the shell layer. Accordingly, the quantum dot QD according to an embodiment may provide a stable quantum dot in a large size by keeping suitable absorption and light emitting intensity despite an increased thickness of the shell layer, and quantum dots of various suitable sizes may be provided as needed.

FIG. 7 is a graph measuring luminous efficiency (PL QY) when a thickness h of a shell layer increases in light emitting elements Ex1 and Ex2 of Examples 1-2 and a light emitting element R1 of a Comparative Example. The light emitting element Ext of Example 1 includes a quantum dot having a core containing $In_{0.84}Al_{0.16}P$, a first core layer containing InP, and a shell layer containing ZnSe, the light emitting element Ex2 of Example 2 includes a quantum dot having a core containing $In_{0.54}Ga_{46}P$, a first core layer containing InP, and a shell layer containing ZnSe, and the light emitting element R1 of Comparative Example includes a core layer containing InP and a shell layer containing ZnSe. Other configurations are the same in both Examples 1-2 and Comparative Example.

Referring to FIG. 7, it was found that in the light emitting element R1 of Comparative Example, the luminous efficiency PL QY rapidly decreased with an increased thickness h of the shell layer. Meanwhile, it was found that in each of the light emitting elements Ext and Ex2 of Examples 1-2, the luminous efficiency PL QY is relatively kept (e.g., is kept relatively constant) despite an increased thickness h of the shell layer. Without being bound by any specific theories, it is understood that this is (e.g., likely) because when including only a core layer having a large difference in lattice constant with the shell layer, particle stress may be caused (e.g., produced) due to an increased thickness of the shell layer, and deformation, etc., may be caused (e.g., produced) at a displaced portion of the interface between layers, resulting in defects in quantum dots so as to decrease luminous efficiency. Meanwhile, the quantum dot according to an embodiment includes an inner core layer having a small difference in lattice constant with the shell layer to reduce or prevent defects that may be caused in the quantum dot despite an increased thickness of the shell layer, thereby maintaining high efficiency.

Figure 8:
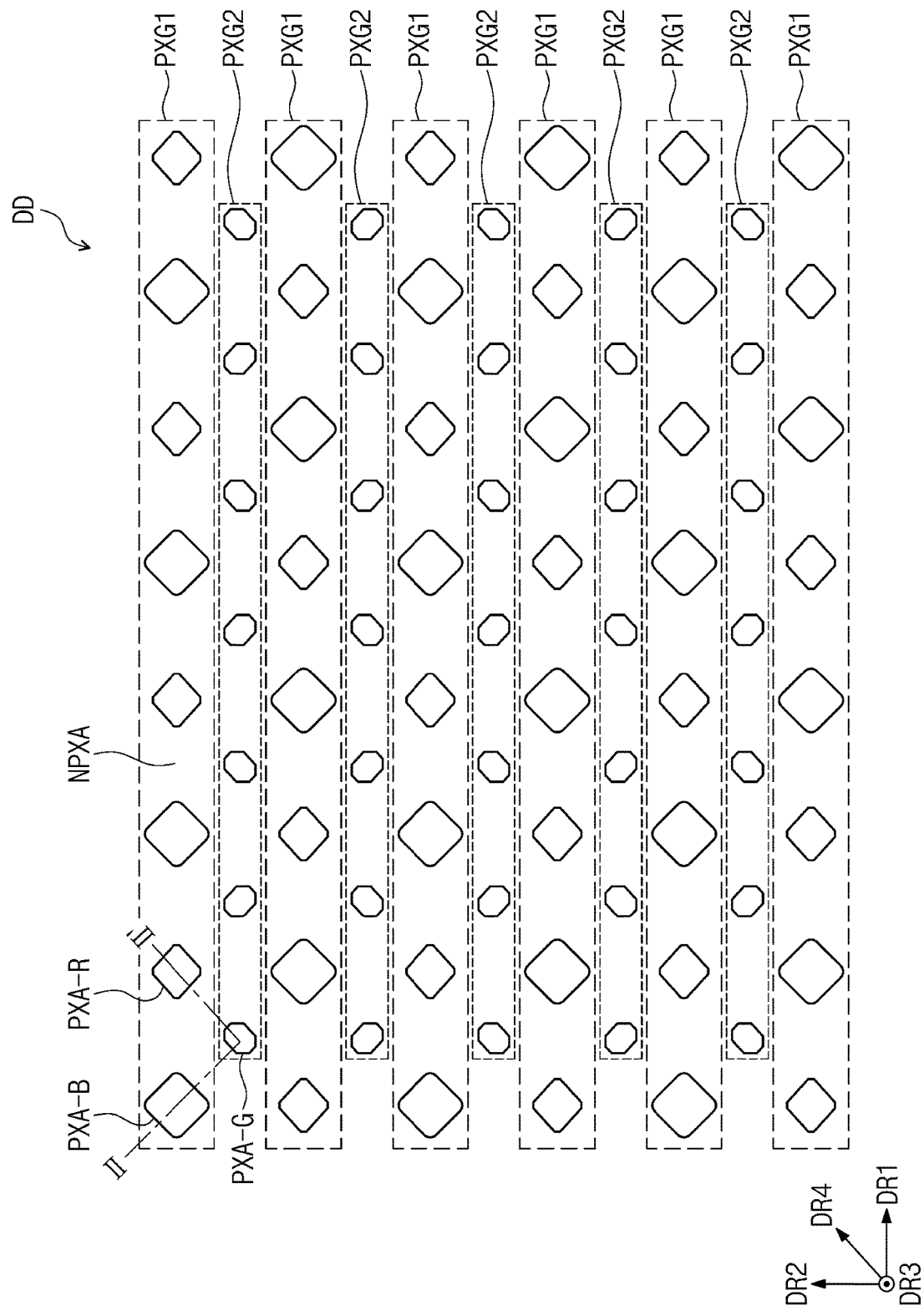
FIG. 8 is an enlarged plan view of a portion of a display device according to an embodiment.
Figure 9:
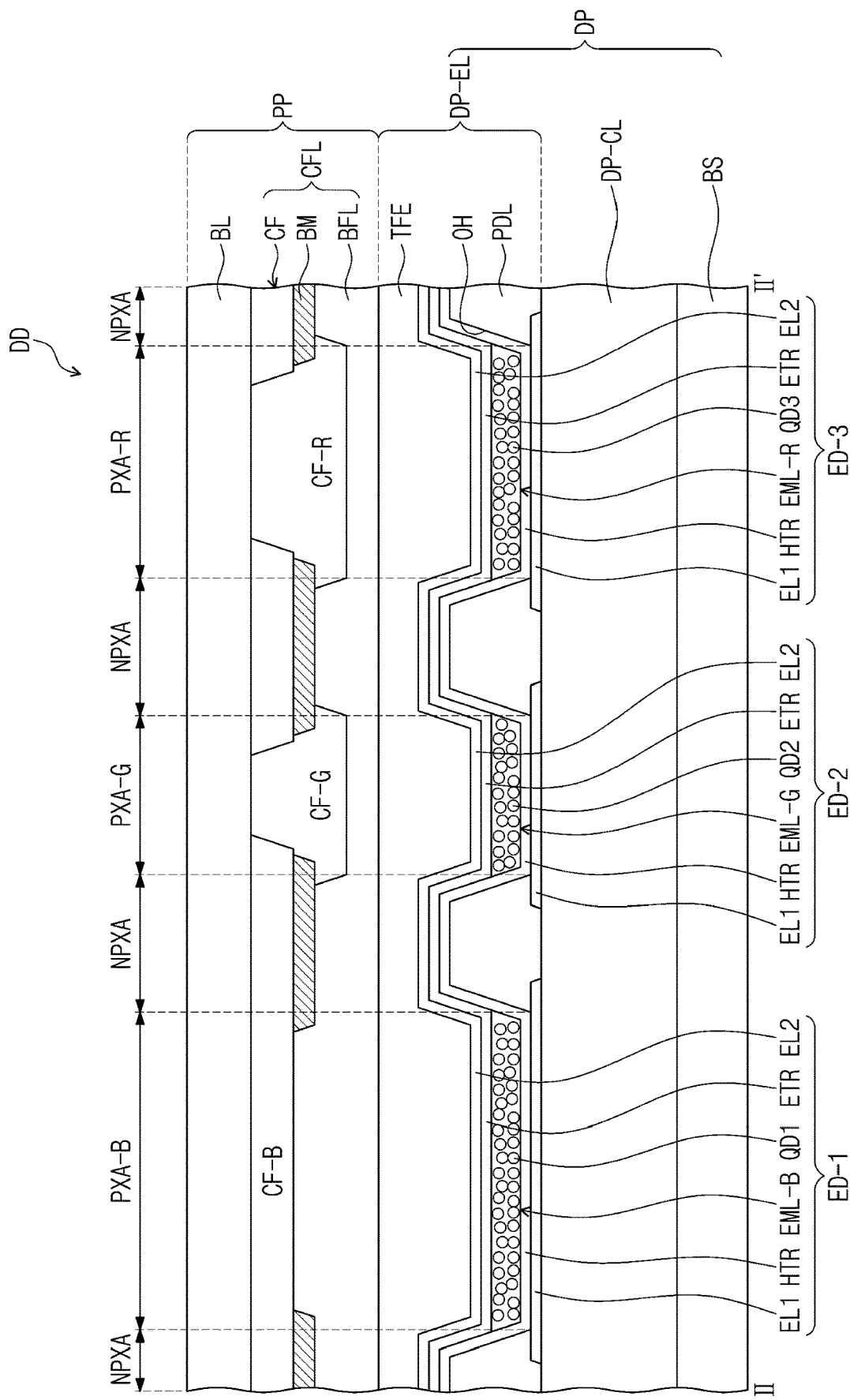
FIG. 9 is a cross-sectional view of a display device according to an embodiment.
Figure 10:
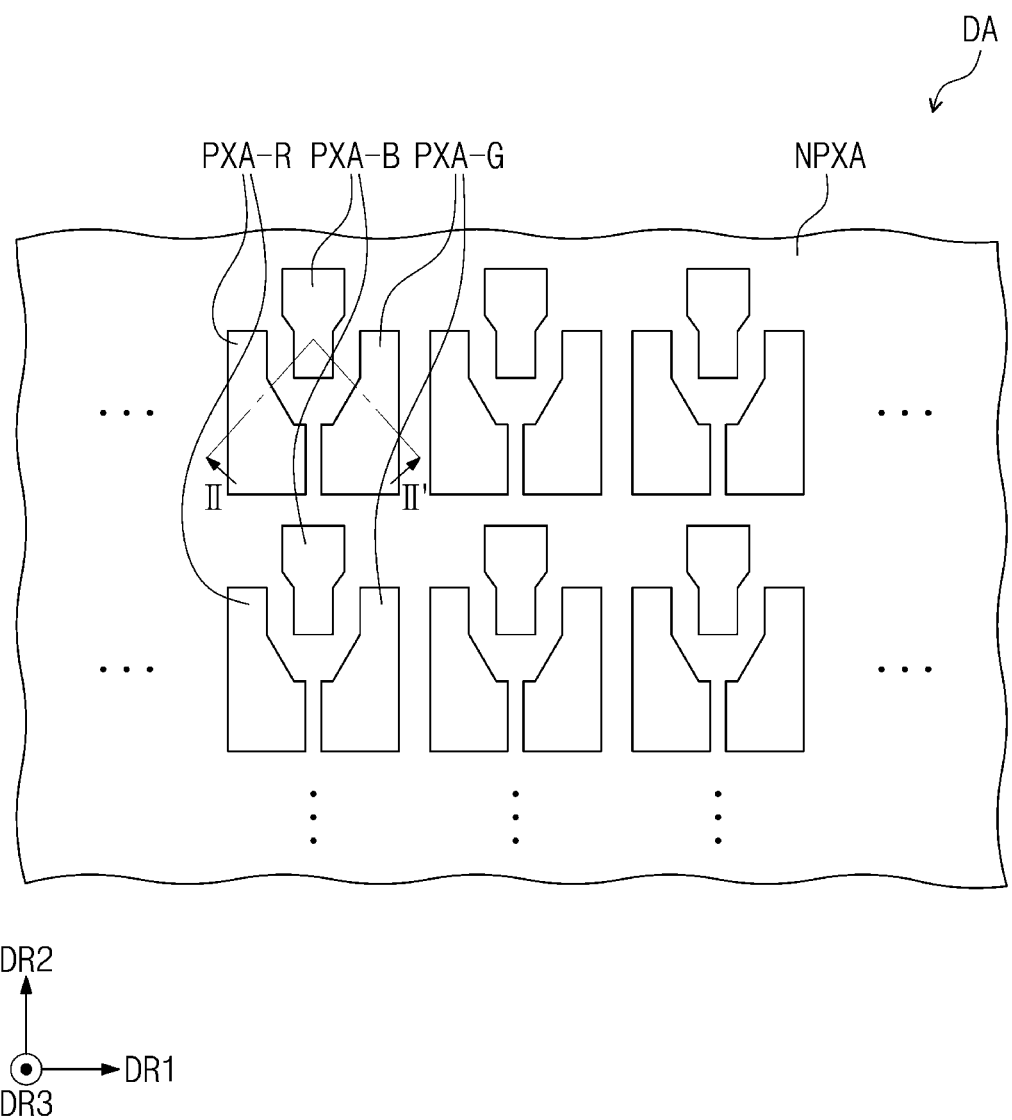
FIG. 10 is an enlarged plan view of a portion of a display device according to an embodiment.
Figure 11:
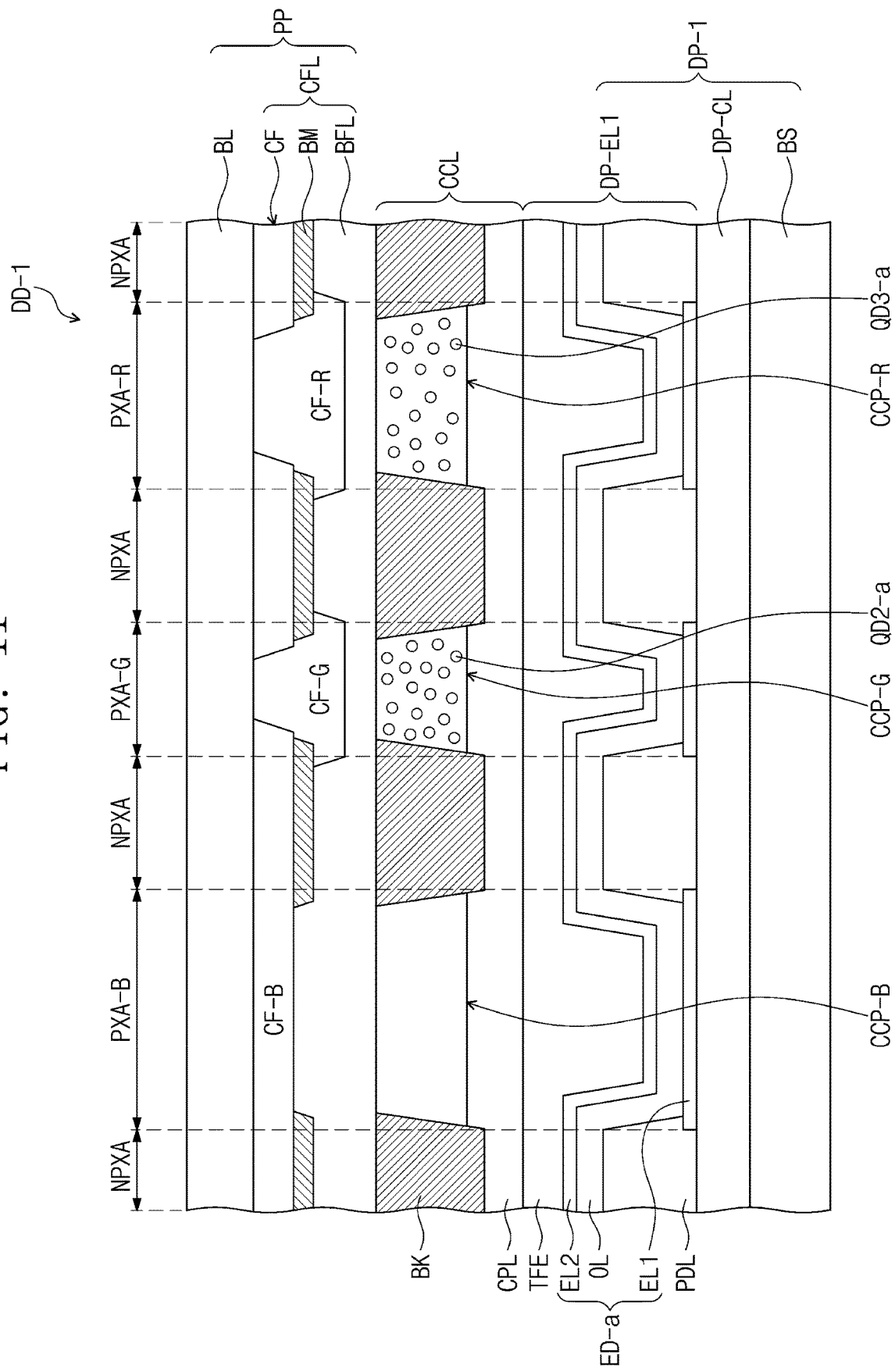
FIG. 11 is a cross-sectional view of a display device according to an embodiment.

FIG. 8 is an enlarged plan view of a portion of a display device DD according to an embodiment. FIG. 9 is a cross-sectional view of a display device DD according to an embodiment. FIG. 9 shows a portion corresponding to the line II-II' of FIG. 8. FIG. 10 is an enlarged plan view of a portion of a display device according to another embodiment. FIG. 11 is a cross-sectional view of a display device DD-1 according to another embodiment. FIG. 10 shows a portion of a display area DA of a display panel according to an embodiment of the present disclosure. FIG. 11 shows a portion corresponding to the line II-II' of FIG. 10.

Referring to FIGS. 8 to 11, the display device DD may include a non-light emitting area NPXA and light emitting areas PXA-B, PXA-G and PXA-R. Each of the light emitting areas PXA-B, PXA-G and PXA-R may be an area emitting light generated from each of light emitting elements ED-1, ED-2 and ED-3, respectively. The light emitting areas PXA-B, PXA-G and PXA-R may be spaced apart from one another on a plane (e.g., when viewed from direction DR3).

The light emitting areas PXA-B, PXA-G and PXA-R may be divided into a plurality of groups according to colors of light generated from the light emitting elements ED-1, ED-2 and ED-3. In display devices DD and DD-1 of an embodiment illustrated in FIGS. 8 to 11, three light emitting areas PXA-B, PXA-G and PXA-R emitting blue light, green light, and red light respectively are illustrated as an example. For example, the display devices DD and DD-1 of an embodiment may include a blue light emitting area PXA-B, a green light emitting area PXA-G and a red light emitting area PXA-R, which are distinct (e.g., separated) from one another.

Referring to FIG. 8, the blue light emitting areas PXA-B and the red light emitting areas PXA-R may be alternately arranged in the first direction DR1 to form a first group PXG1. The green light emitting areas PXA-G may be arranged in the first direction DR1 to form a second group PXG2. The first group PXG1 and the second group PXG2 may be spaced apart in the second direction DR2. Each of the first group PXG1 and the second group PXG2 may be provided in plurality. The first groups PXG1 and the second groups PXG2 may be alternately arranged in the second direction DR2. One green light emitting area PXA-G may be disposed spaced apart from one blue light emitting area PXA-B or one red light emitting area PXA-R in the fourth direction DR4. The fourth direction DR4 may be a direction between the first direction DR1 and the second direction DR2. The arrangement structure of the light emitting areas PXA-B, PXA-G and PXA-R shown in FIG. 8 may be referred to as a Pantile® structure.

In another embodiment, referring to FIG. 10, from among the light emitting areas PXA-R, PXA-B, and PXA-G, the red light emitting area PXA-R and the green light emitting area PXA-G may have a shape symmetrical around a reference axis extending in the direction DR2, and the blue light emitting area PXA-B may be disposed between the red light emitting area PXA-R and the green light emitting area PXA-G. When viewed from the first direction DR1, a portion of the blue light emitting area PXA-B may not overlap the red light emitting area PXA-R and the green light emitting area PXA-G.

However, the embodiment of the present disclosure is not limited thereto, and the light emitting areas PXA-R, PXA-B, and PXA-G may have various suitable shapes such as a polygonal or circular shape, and an arrangement structure of the light emitting areas is also not particularly limited. For example, in an embodiment, the light emitting areas PXA-B, PXA-G and PXA-R may have a stripe structure in which the blue light emitting area PXA-B, the green light emitting area PXA-G, and the red light emitting area PXA-R may be alternately arranged along the first direction DR1.

Referring to FIG. 9, the plurality of light emitting elements ED-1, ED-2 and ED-3 may emit light in different wavelength ranges. For example, in an embodiment, the display device DD may include a first light emitting element ED-1 emitting blue light, a second light emitting element ED-2 emitting green light, and a third light emitting element ED-3 emitting red light. However, the embodiment of the present disclosure is not limited thereto, and the first to third light emitting elements ED-1, ED-2 and ED-3 may emit light in the same wavelength range or emit light in at least one different wavelength range.

For example, the blue light emitting area PXA-B, the green light emitting area PXA-G, and the red light emitting area PXA-R of the display device DD may correspond to the first light emitting element ED-1, the second light emitting element ED-2, and the third light emitting element ED-3, respectively.

The display device DD of an embodiment may include a plurality of light emitting elements ED-1, ED-2, and ED-3, and at least one selected from the light emitting elements ED-1, ED-2, and ED-3 may include emission layers EML-B, EML-G, and EML-R containing quantum dots QD1, QD2, and QD3 according to an embodiment.

In addition, the display device DD of an embodiment may include a display panel DP having the plurality of light emitting elements ED-1, ED-2, and ED-3, and a light control layer PP disposed on the display panel DP. In some embodiments, unlike the one shown in the drawings, the light control layer PP may be omitted in the display device DD of an embodiment.

The display panel DP may include a base substrate BS, a circuit layer DP-CL provided on the base substrate BS, and a display element layer DP-EL. The display element layer DP-EL may include a pixel defining film PDL, light emitting elements ED-1, ED-2, and ED-3 disposed between the pixel defining film PDL, and an encapsulation layer TFE disposed on the light emitting elements ED-1, ED-2, and ED-3.

A first emission layer EML-B of the first light emitting element ED-1 may include a first quantum dot QD1. The first quantum dot QD1 may emit blue light, which is the first light.

The second emission layer EML-G of the second light emitting element ED-2, and the third emission layer EML-R of the third light emitting element ED-3 may include a second quantum dot QD2 and a third quantum dot QD3, respectively. The second quantum dot QD2 and the third quantum dot QD3 may emit green light, which is the second light, and red light, which is the third light, respectively.

At least one selected from the first to third quantum dots QD1, QD2, and QD3 may be a quantum dot according to the above-described embodiment. In an embodiment, the second quantum dot QD2 may be a quantum dot according to the above-described embodiment. However, the embodiment of the present disclosure is not limited thereto, and the first to third quantum dots QD1, QD2, and QD3 may each be a quantum dot according to the above-described embodiment.

In an embodiment, the first to third quantum dots QD1, QD2, and QD3 included in the light emitting elements ED-1, ED-2, and ED-3 may be formed of different core materials. In an embodiment, the first to third quantum dots QD1, QD2, and QD3 may be formed of the same core material, or two quantum dots selected from the first to third quantum dots QD1, QD2, and QD3 may be formed of the same core material, and the rest may be formed of different core materials.

In an embodiment, the first to third quantum dots QD1, QD2, and QD3 may have different diameters. For example, the first quantum dot QD1 utilized in the first light emitting element ED-1 emitting light in a relatively short wavelength range may have a relatively smaller average diameter than the second quantum dot QD2 of the second light emitting element ED-2 and the third quantum dot QD3 of the third light emitting element ED-3, each emitting light in a relatively longer wavelength range.

In the present description, the average diameter refers to the arithmetic mean of the diameters of a plurality of quantum dot particles. Meanwhile, the diameter of the quantum dot particle may be an average value of the width of the quantum dot particle in a cross section.

The relationship of the average diameters of the first to third quantum dots QD1, QD2 and QD3 is not limited to the above limitations. That is, FIG. 9 illustrates that the first to third quantum dots QD1, QD2, and QD3 are similar in size from one another, but unlike the one illustrated, the first to third quantum dots QD1, QD2, and QD3 included in the light emitting elements ED-1, ED-2, and ED-3 may be different in size. In addition, the average diameter of two quantum dots selected from the first to third quantum dots QD1, QD2, and QD3 may be similar, and the rest may be different.

In the display device DD of an embodiment shown in FIGS. 8 and 10, areas of the light emitting areas PXA-B, PXA-G and PXA-R may each be different from one another. In this case, the area may refer to an area when viewed on a plane (e.g., in a plan view) defined by the first direction DR1 and the second direction DR2.

The light emitting areas PXA-B, PXA-G and PXA-R may have different areas according to colors emitted from the emission layers EML-B, EML-G and EML-R of the light emitting elements ED-1, ED-2 and ED-3. For example, referring to FIGS. 8 and 10, the blue light emitting area PXA-B corresponding to the first light emitting element ED-1 emitting blue light may have a largest area, and the green light emitting area PXA-G corresponding to the second light emitting element ED-2 generating green light may have a smallest area in the display device DD of an embodiment. However, the embodiment of the present disclosure is not limited thereto, and the light emitting areas PXA-B, PXA-G and PXA-R may emit light other than blue light, green light and red light, or the light emitting areas PXA-B, PXA-G and PXA-R may each have the same area, or the light emitting areas PXA-B, PXA-G, and PXA-R may be provided at different area ratios from those shown in FIG. 8.

Each of the light emitting areas PXA-B, PXA-G and PXA-R may be an area separated by a pixel defining film PDL. The non-light emitting areas NPXA may be areas between neighboring light emitting areas PXA-B, PXA-G and PXA-R, and may correspond to the pixel defining film PDL. In the present description, each of the light emitting areas PXA-B, PXA-G and PXA-R may correspond to a pixel. The pixel defining film PDL may separate the light emitting elements ED-1, ED-2 and ED-3. The emission layers EML-B, EML-G and EML-R of the light emitting elements ED-1, ED-2 and ED-3 may be disposed and separated in respect openings OH defined by the pixel defining film PDL.

The pixel defining film PDL may be formed of a polymer resin. For example, the pixel defining film PDL may be formed of a polyacrylate-based resin and/or a polyimide-based resin. In addition, the pixel defining film PDL may be formed by further including an inorganic material in addition to the polymer resin. In some embodiments, the pixel defining film PDL may be formed to include a light absorbing material, and/or may be formed to include a black pigment and/or a black dye. The pixel defining film PDL formed to include a black pigment and/or a black dye may implement a black pixel defining film. When forming the pixel defining film PDL, carbon black may be utilized as a black pigment and/or a black dye, but the embodiment of the present disclosure is not limited thereto.

In addition, the pixel defining film PDL may be formed of an inorganic material. For example, the pixel defining film PDL may be formed from silicon nitride (SiNx), silicon oxide (SiOx), silicon oxide (SiOxNy), etc. The pixel defining film PDL may define the light emitting areas PXA-B, PXA-G, and PXA-R. The light emitting areas PXA-B, PXA-G, and PXA-R, and a non-light emitting area NPXA may be separated by the pixel defining film PDL.

Each of the light emitting elements ED-1, ED-2 and ED-3 may include a first electrode EL1, a hole transport region HTR, emission layer EML-B, EML-G or EML-R, an electron transport region ETR, and a second electrode EL2. The description in connection with FIG. 4 may be equally applied to the first electrode EL1, the hole transport region HTR, the electron transport region ETR, and the second electrode EL2, except that the first to third quantum dots QD1, QD2, and QD3 included in the emission layers EML-B, EML-G, and EML-R are different from one another in the light emitting elements ED-1, ED-2, and ED-3 included in the display device DD of an embodiment. In some embodiments, each of the light emitting elements ED-1, ED-2, and ED-3 may further include a capping layer between the second electrode EL2 and the encapsulation layer TFE.

The encapsulation layer TFE may cover the light emitting elements ED-1, ED-2 and ED-3. The encapsulation layer TFE may be a single layer or a stack of a plurality of layers. The encapsulation layer TFE may be a thin film encapsulation layer. The encapsulation layer TFE protects the light emitting elements ED-1, ED-2 and ED-3. The encapsulation layer TFE may cover an upper surface of the second electrode EL2 disposed in the opening OH, and may fill the opening OH.

In FIG. 9, the hole transport region HTR and the electron transport region ETR are illustrated as being provided as a common layer while covering the pixel defining film PDL, but the embodiment of the present disclosure is not limited thereto. In an embodiment, the hole transport region HTR and the electron transport region ETR may be disposed (e.g., only) in the opening OH defined by the pixel defining film PDL.

For example, when the hole transport region HTR and the electron transport region ETR in addition to the emission layers EML-B, EML-G, and EML-R are provided through an inkjet printing method, the hole transport region HTR, the emission layers EML-B, EML-G, and EML-R, the electron transport region ETR, etc., may be provided corresponding to the opening OH defined between (or within) the pixel defining layer PDL. However, the embodiment of the present disclosure is not limited thereto, and as shown in FIG. 9, the hole transport region HTR and the electron transport region ETR may cover the pixel defining layer PDL without being patterned, and be provided as one common layer regardless of a method of providing each functional layer.

In the display device DD of an embodiment illustrated in FIG. 9, although the thicknesses of the emission layers EML-B, EML-G, and EML-R of the first to third light emitting elements ED-1, ED-2, and ED-3 are illustrated to be similar to one another, the embodiment of the present disclosure is not limited thereto. For example, in an embodiment, the thicknesses of the emission layers EML-B, EML-G, and EML-R of the first to third light emitting elements ED-1, ED-2, and ED-3 may be different from one another.

Referring to FIG. 9, the display device DD of an embodiment may further include a light control layer PP. The light control layer PP may block external light (from outside the display device DD) from incident to the display panel DP. In some embodiments, the light control layer PP may block a part of the external light. The light control layer PP may perform an anti-reflection function reducing or minimizing reflection due to external light.

In an embodiment illustrated in FIG. 9, the light control layer PP may include a color filter layer CFL. That is, the display device DD of an embodiment may further include the color filter layer CFL disposed on the light emitting elements ED-1, ED-2, and ED-3 of the display panel DP.

In the display device DD of an embodiment, the light control layer PP may include a base layer BL and a color filter layer CFL.

The base layer BL may be a member providing a base surface on which the color filter layer CFL is disposed. The base layer BL may be a glass substrate, a metal substrate, a plastic substrate, etc. However, the embodiment of the present disclosure is not limited thereto, and the base layer BL may be an inorganic layer, an organic layer, or a composite material layer.

The color filter layer CFL may include a light blocking unit BM and a color filter CF. The color filter may include a plurality of filters CF-B, CF-G, and CF-R. That is, the color filter layer CFL may include a first filter CF-B configured to transmit the first light, a second filter CF-G configured to transmit the second light, and a third filter CF-R configured to transmit the third light. For example, the first filter CF-B may be a blue filter, the second filter CF-G may be a green filter, and the third filter CF-R may be a red filter.

Each of the filters CF-B, CF-G, and CF-R may include a polymer photosensitive resin and a pigment and/or a dye. The first filter CF-B may include a blue pigment and/or a blue dye, the second filter CF-G may include a green pigment and/or a green dye, and the third filter CF-R may include a red pigment and/or a red dye.

The embodiment of the present disclosure is not limited thereto, and the first filter CF-B may not include a pigment or a dye. The first filter CF-B may include a polymer photosensitive resin, but not include a pigment or a dye. In some embodiments, the first filter CF-B may be transparent. The first filter CF-B may be formed of a transparent photosensitive resin.

The light blocking unit BM may be a black matrix. The light blocking unit BM may be formed from an organic light blocking material or an inorganic light blocking material, both including a black pigment and/or a black dye. The light blocking unit BM may reduce or prevent light leakage, and separate boundaries between the adjacent filters CF-B, CF-G, and CF-R.

The color filter layer CFL may further include a buffer layer BFL. For example, the buffer layer BFL may be a protection layer protecting the filters CF-B, CF-G, and CF-R. The buffer layer BFL may be an inorganic material layer including at least one inorganic material selected from silicon nitride, silicon oxide, and silicon oxynitride. The buffer layer BFL may be formed of a single layer or a plurality of layers.

In an embodiment shown in FIG. 9, the first filter CF-B of the color filter layer CFL is illustrated to overlap the second filter CF-G and the third filter CF-R, but the embodiment of the present disclosure is not limited thereto. For example, the first to third filters CF-B, CF-G and CF-R may be separated by the light blocking unit BM and may not overlap one another. Meanwhile, in an embodiment, each of the first to third filters CF-B, CF-G and CF-R may be disposed corresponding to each of the blue light emitting area PXA-B, green light emitting area PXA-G, and red light emitting area PXA-R.

Unlike what is shown in FIG. 9, the display device DD of an embodiment may include a polarizing layer as a light control layer PP instead of the color filter layer CFL. The polarizing layer may block external light provided to the display panel DP from the outside. In some embodiments, the polarizing layer may block a part of external light.

In addition, the polarizing layer may reduce reflected light generated in the display panel DP due to external light. That is, the polarizing layer may reduce reflection of external light by the display panel DP. For example, the polarizing layer may function to block reflected light in a case where light provided from outside the display device DD is incident to the display panel DP and exits again. The polarizing layer may be a circularly polarizer (e.g., a circular polarizing filter) having an anti-reflection function or the polarizing layer may include a linear polarizer and a λ/4 phase retarder. Meanwhile, the polarizing layer may be disposed on the base layer BL to be exposed (e.g., to the outside) or the polarizing layer may be disposed below the base layer BL.

Referring to FIG. 11, the display device DD-1 of an embodiment may include a light conversion layer CCL disposed on a display panel DP-1. In addition, the display device DD-1 according to an embodiment may further include a color filter layer CFL. The color filter layer CFL may be disposed between the base layer BL and the light conversion layer CCL.

The display panel DP-1 may be a light emitting display panel. For example, the display panel DP-1 may be an organic electroluminescence display panel or a quantum dot light emitting display panel.

The display panel DP-1 may include a base substrate BS, a circuit layer DP-CL provided on the base substrate BS, and a display element layer DP-EL1.

The display element layer DP-EL1 includes a light emitting element ED-a, and the light emitting element ED-a may include a first electrode EL1 and a second electrode EL2 facing each other, and a plurality of layers OL disposed between the first electrode EL1 and the second electrode EL2. The plurality of layers OL may include the hole transport region HTR (FIG. 4), the emission layer EML (FIG. 4), and the electron transport region ETR (FIG. 4). An encapsulation layer TFE may be further disposed on the light emitting element ED-a.

In the light emitting element ED-a, the same description as the one described with reference to FIG. 4 may be applied to the first electrode EL1, the hole transport region HTR, the electron transport region ETR, and the second electrode EL2. However, in the light emitting element ED-a included in the display panel DP-1 of an embodiment, the emission layer EML may include a host and a dopant which are organic electroluminescent materials or may include the quantum dots according to an embodiment described above. In the display panel DP-1 of an embodiment, the light emitting element ED-a may emit blue light.

The light conversion layer CCL may include a plurality of partition walls BK disposed spaced apart from each other and light control units CCP-B, CCP-G and CCP-R disposed between the partition walls BK. The partition walls BK may be formed from a polymer resin and a coloring additive. The partition walls BK may be formed from a light absorbing material, or formed from a pigment and/or a dye. For example, the partition walls BK may be formed to include a black pigment and/or a black dye to implement a black partition wall. When forming the black partition wall, carbon black, etc., may be utilized as a black pigment and/or a black dye, but the embodiment of the present disclosure is not limited thereto.

The light conversion layer CCL may include a first light control unit CCP-B configured to transmit the first light, a second light control unit CCP-G including a fourth quantum dot QD2-a converting the first light to a second light, and a third light control unit CCP-R including a fifth quantum dot QD3-a converting the first light to a third light. The second light may be light of a longer wavelength range than the first light, and the third light may be light of a longer wavelength range than each of the first light and the second light. For example, the first light may be blue light, the second light may be green light, and the third light may be red light. Any one of quantum dots QD2-a or QD3-a may be included in the light control units CCP-B, CCP-G and/or CCP-R, the same description as the one for the quantum dots according to an embodiment described above may be applied.

The light conversion layer CCL may further include a capping layer CPL. The capping layer CPL may be disposed on the light control units CCP-B, CCP-G and CCP-R and the partition walls BK. The capping layer CPL may serve to reduce or prevent penetration of moisture and/or oxygen (hereinafter, referred to as "moisture/oxygen"). The capping layer may be disposed on the light control units CCP-B, CCP-G and CCP-R to prevent or substantially prevent the light control units CCP-B, CCP-G and CCP-R from being exposed to moisture/oxygen. The capping layer CPL may include at least one inorganic layer.

The display device DD-1 of an embodiment may include a color filter layer CFL disposed on the light conversion layer CCL, and the descriptions in connection with FIG. 9 may be equally applied to the color filter layer CFL and the base layer BL.

A quantum dot of an embodiment includes a core and a shell layer, and a difference in lattice constants between the core and the shell layer is controlled to be 3% or less, and high luminous efficiency may thus be maintained regardless of a thickness of the shell layer.

A light emitting element and a display device of an embodiment may include quantum dots having improved stability in an emission layer, thereby exhibiting improved luminous efficiency and element service life.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention."

As used herein, the terms "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to a preferred embodiment of the present disclosure, it will be understood that the present disclosure should not be limited to these preferred embodiments but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:
1. A quantum dot comprising:
a core;
a shell layer around the core, and
a first core layer between the core and the shell layer, the first core layer being around the core,
wherein a difference in lattice constants between the core and the shell layer is 3% or less,
the first core layer comprises a Group 13 element and a Group 15 element, and
the core comprises all elements comprised in the first core layer and further comprises at least one Group 13 element.
2. The quantum dot of claim 1, wherein
the shell layer comprises a Group 12 element and a Group 16 element.
3. The quantum dot of claim 1, wherein the core is greater in thickness than the first core layer, the thickness of the core being an average distance from a central portion of the core to a surface of the core.
4. The quantum dot of claim 3, wherein
the core is about 1 nm to about 2 nm in thickness, and
the first core layer is about 0 nm to about 1 nm in thickness.
5. The quantum dot of claim 1, wherein a difference in lattice constants between the shell layer and the first core layer is 4% or greater.
6. The quantum dot of claim 1, wherein the shell layer is greater in thickness than the first core layer.
7. The quantum dot of claim 1, wherein the shell layer is 1 nm or greater in thickness.
8. The quantum dot of claim 1, wherein the shell layer comprises a compound represented by Formula 3 below:

$$EF_zF'_{1-z} \qquad \text{Formula 3}$$

wherein, in Formula 3 above,
E is a Group 12 element,
F and F' are each independently a Group 16 element, and
z is 0 to 1.
9. The quantum dot of claim 8, wherein the shell layer comprises $ZnSe_zS_{1-z}$, and z is 0 to 1.
10. The quantum dot of claim 1, wherein the first core layer comprises a compound represented by Formula 1 below, and the core comprises a compound represented by Formula 2 below:

$$AB \qquad \text{Formula 1}$$

$$A_{1-y}(A'_xA''_{1-x})_yB \qquad \text{Formula 2}$$

and wherein, in Formulas 1 and 2,

A, A', and A" are each independently a Group 13 element,

B is a Group 15 element, and x and y are each independently greater than 0 and less than 1.

11. The quantum dot of claim 10, wherein the core comprises $In_{1-y}(Ga_xAl_{1-x})_yP$, the first core layer comprises InP, and x and y are each independently greater than 0 and less than 1.

12. A light emitting element comprising:

a first electrode;

a hole transport region on the first electrode;

an emission layer on the hole transport region and comprising a plurality of quantum dots;

an electron transport region on the emission layer; and a second electrode on the electron transport region, wherein the plurality of quantum dots each comprise a core, a first core layer around the core, and a shell layer around the first core layer, and a difference in lattice constants between the core and the shell layer is 3% or less.

13. The light emitting element of claim 12, wherein the core and the first core layer each independently comprise a Group 13 element and a Group 15 element, and the shell layer comprises a Group 12 element and a Group 16 element.

14. The light emitting element of claim 12, wherein the core is about 1 nm to about 2 nm in thickness, the thickness of the core being an average distance from a central portion of the core to a surface of the core, the first core layer is about 0 nm to about 1 nm in thickness, and the shell layer is 1 nm or greater in thickness.

15. A display device comprising:

a display panel; and a light conversion layer on the display panel and comprising at least one light control unit comprising quantum dots, wherein the quantum dots each comprise a core and a shell layer around the core, and have a difference in lattice constants of 3% or less between the shell layer and the core.

16. The display device of claim 15, wherein the display panel comprises a light emitting element configured to generate a first light, and the light conversion layer comprises:

a first light control unit configured to transmit the first light;

a second light control unit configured to convert the first light into a second light; and a third light control unit configured to convert the first light into a third light.

17. The display device of claim 15, further comprising a first core layer between the core and the shell layer, the first core layer being around the core.

18. The display device of claim 15, further comprising a color filter layer on the light conversion layer, wherein the color filter layer comprises:

a first filter configured to transmit a first light;

a second filter configured to transmit a second light; and a third filter configured to transmit a third light.

* * * * *